United States Patent
Yu et al.

(10) Patent No.: US 9,728,427 B2
(45) Date of Patent: *Aug. 8, 2017

(54) METHOD FOR MANUFACTURING SEMICONDUCTOR STRUCTURE

(71) Applicant: TAIWAN SEMICONDUCTOR MANUFACTURING COMPANY LTD., Hsinchu (TW)

(72) Inventors: Chen-Hua Yu, Hsinchu (TW); Chih-Fan Huang, Kaoshung (TW); Chun-Hung Lin, Taipei (TW); Ming-Da Cheng, Hsinchu Country (TW); Chung-Shi Liu, Hsinchu (TW); Mirng-Ji Lii, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/077,237

(22) Filed: Mar. 22, 2016

(65) Prior Publication Data

US 2016/0204042 A1 Jul. 14, 2016

Related U.S. Application Data

(62) Division of application No. 14/183,913, filed on Feb. 19, 2014, now Pat. No. 9,324,587.

(51) Int. Cl.
| | | |
|---|---|---|
| H01L 21/56 | (2006.01) | |
| H01L 29/78 | (2006.01) | |
| H01L 25/00 | (2006.01) | |
| H01L 23/00 | (2006.01) | |
| H01L 21/66 | (2006.01) | |
| H01L 21/268 | (2006.01) | |
| H01L 23/31 | (2006.01) | |

(52) U.S. Cl.
CPC .......... *H01L 21/566* (2013.01); *H01L 21/268* (2013.01); *H01L 21/561* (2013.01); *H01L 22/12* (2013.01); *H01L 23/562* (2013.01); *H01L 25/50* (2013.01); *H01L 29/7847* (2013.01); *H01L 23/3121* (2013.01); *H01L 2924/0002* (2013.01)

(58) Field of Classification Search
CPC ... H01L 29/7847; H01L 21/561; H01L 25/50; H01L 23/562; H01L 23/3121
See application file for complete search history.

(56) References Cited

U.S. PATENT DOCUMENTS 9,324,587 B2 * 4/2016 Yu .................. H01L 21/566

* cited by examiner

*Primary Examiner* — Thanhha Pham
(74) *Attorney, Agent, or Firm* — WPAT, P.C., Intellectual Property Attorneys; Anthony King

(57) ABSTRACT

A method includes followings operations. A substrate including a first surface and a second surface is provided. The substrate and a transparent film are heated to attach the transparent film on the first surface. A first coefficient of a thermal expansion (CTE) mismatch is between the substrate and the transparent film. The substrate and the transparent film are cooled. A polymeric material is disposed on the second surface. A second CTE mismatch is between the substrate and the polymeric material. The second CTE mismatch is counteracted by the first CTE mismatch.

20 Claims, 18 Drawing Sheets

METHOD FOR MANUFACTURING SEMICONDUCTOR STRUCTURE

PRIORITY CLAIM AND CROSS-REFERENCE

This application is a divisional application of U.S. patent application Ser. No. 14/183,913, filed on Feb. 19, 2014.

BACKGROUND

Presently, electronic equipment are essential for many modern applications. Therefore, consumers are increasingly demanding more processing power, lower electrical power usage and cheaper devices. As the electronic industry strives to meet these demands and more complicated and denser configurations, miniaturization will result in an extension of the number of chips per wafer and the number of transistors per chip, as well as a reduction in power usage. Wafer level packaging (WLP) technology has been gaining popularity since the electronic components are being designed to be lighter, smaller, more multifunctional, more powerful, more reliable and less expensive. The WLP technology combines dies having different functionalities at a wafer level, and is widely applied in order to meet continuous demands toward the miniaturization and higher functions of the electronic components.

Stacking multiple layers of different materials on a substrate in WLP technology raises concerns about different coefficients of thermal expansion (CTE) among those layers. In contrast to a traditional packaging technology, the WLP technology is crafted on a greater scale and in a more complicated working environment. Some factors may lead to warpage of WLP as a whole, such as the differences in CTE among the stacking multiple layers. Since the CTE mismatch in the WLP technology is poorly controlled, improvements in the method for a WLP continue to be sought.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

A more complete understanding of the present disclosure may be derived by referring to the detailed description and claims when considered in connection with the Figures, where like reference numbers refer to similar elements throughout the Figures, and:

DETAILED DESCRIPTION

Figure 1:
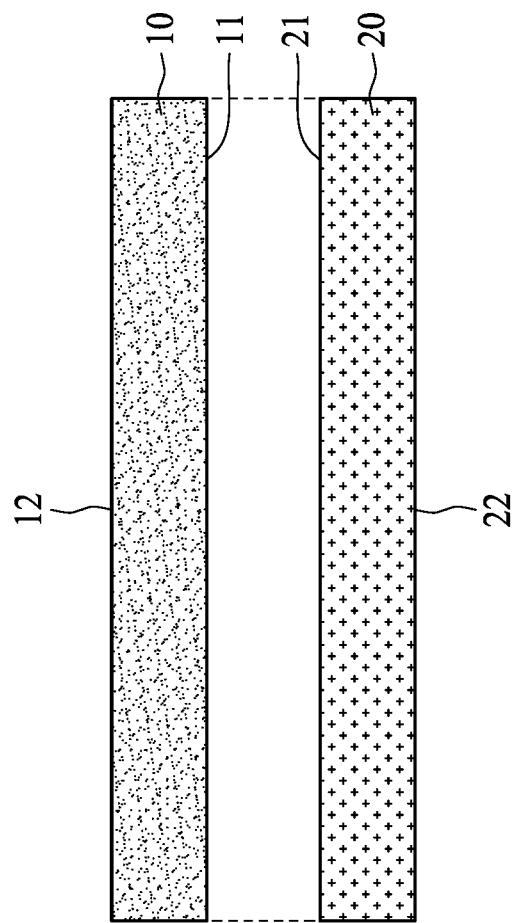
FIG. 1 is a cross-sectional view of a substrate including a first surface and a second surface in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In the present disclosure, a film or layer with a predetermined CTE value is attached under a substrate, on which several layers will be stacked. According to a CTE mismatch between the substrate and those layers, the film is adjusted to cause the CTE mismatch to be reduced or eliminated. Thus, the warpage of WLP leading to a malfunction of a to-be-singulated integrated circuit is avoided.

In various embodiments, a substrate and a transparent film are heated and bonded with each other and then both of which are cooled down. Since a CTE of the transparent film is different from a CTE of the substrate, a CTE mismatch therebetween is formed and used to counteract a CTE mismatch between the substrate and those layers thereon. By such design, a temperature responsive warpage counteracting assembly including the substrate and the transparent film is provided so as to avoid the warpage of WLP. In some embodiments, a preplanned internal stress is formed between the transparent film and the substrate. When the molding compound covers integrated circuits (ICs) or dies above the substrate, another internal stress generated from a CTE mismatch among the substrate, the ICs, and the molding compound is compensated by the preplanned internal stress so as to prevent the warpage of WLP as a whole.

In describing and claiming the present disclosure, the following terminology will be used in accordance with the definitions set forth below.

As used herein, a "substrate" refers to a bulk substrate on which various layers and device structure are formed. In sonic embodiments, the bulk substrate includes silicon or a compound semiconductor, such as GaAs, InP, Si/Ge, or SiC. Examples of the layers include dielectric layers, doped layers, polysilicon layers, or conductive layers. Examples of the device structures include transistors, resistors, and/or capacitors, which are interconnected through an interconnect layer to additional integrated circuits. In some embodiments, the bulk substrate includes a semiconductor substrate such as a polished wafer, an epi wafer, an argon anneal wafer, a hai wafer and a silicon on insulator (SOI) wafer.

As used herein, a "semiconductor substrate" refers to a chip carrier, which is generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation. Active electrical components, such as transistors, have the ability to control the flow of electrical current. Passive electrical components, such as capacitors, inductors, resistors, and transformers, create a relationship between voltage and current that is necessary to perform electrical circuit functions.

As used herein, "active and passive components" refers to components, which are formed on the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into a permanent insulator, permanent conductor, or changing the way the semiconductor material changes in conductivity in response to an electric field. Transistors contain regions of varying types and degrees of doping arranged as necessary to enable the transistor to promote or restrict the flow of electrical current upon the application of an electric field.

Active and passive components are formed by layers of materials with different electrical properties. The layers are formed by a variety of deposition techniques determined in part by the type of material being deposited. For example, thin film deposition involves chemical vapor deposition (CVD), physical vapor deposition (PVD), electrolytic plating, and electroless plating processes. Each layer is generally patterned to form portions of active components, passive components, or electrical connections between components. The layers are patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

As used herein, "back-end manufacturing" refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting device or saw blade. After singulation, the individual dies are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

As used herein, a "light source" recited in the present disclosure is an object emitting a certain kind of electromagnetic radiation in a visible spectrum or a non-visible spectrum. The electromagnetic radiation is selected, but not limited, from a group consisting of chemoluminescence, fluorescence, phosphorescence, cathodoluminescence, electron stimulated luminescence. In certain embodiments, the light source is a 325 nm He—Cd laser.

As used herein, an "aperture" recited in the present disclosure is a hole that is reamed, drilled, milled etc., completely through a substrate. In some embodiments, an aperture is a hole that goes all the way through the substrate. In certain embodiments, there is an object disposed in the aperture so as to form a blind hole, which does not go all the way through the substrate.

In some embodiments, as in FIG. 1, a substrate 10 includes a first surface 11 and a second surface 12. The substrate 10 is a plane structure. When referring herein to a plane structure, the reference includes the concept of a flat plate, which actually has a top flat surface, a bottom flat surface, and a thickness, with the top and bottom flat surfaces technically lying along parallel planes. In other words, the first surface 11 and the second surface 12 are along parallel planes.

In some embodiments, the substrate 10 includes a thickness, which is adjustable in accordance with a desirable condition. The thickness of the substrate 10 is from about 300 µm to about 1400 µm. In certain embodiments, the thickness of the substrate 10 is from about 450 μm to about 1325 μm. In other embodiments, the thickness of the substrate 10 is from about 650 μm to about 1125 μm. In some other embodiments, the thickness of the substrate 10 is from about 775 μm to about 935 μm.

In some embodiments, the substrate 10 is made of silica ($SiO_2$). The substrate 10 has very low thermal expansion and resists high temperatures (about 1000° C. to about 1500° C.). The substrate 10 is also resistant against weathering. In certain embodiments, the substrate 10 is made of silica 72%, sodium oxide ($Na_2O$) 14.2%, magnesia (MgO) 2.5%, lime (CaO) 10.0% and alumina ($Al_2O_3$) 0.6%. In this case, the substrate 10 has a high thermal expansion and poor resistance to heat (about 500° C. to 600° C.). In some certain embodiments, the substrate 10 is made of silica 81%, boric oxide ($B_2O_3$) 12%, soda ($Na_2O$) 4.5%, and alumina ($Al_2O_3$) 2.0%. In this case, the substrate 10 has fairly low coefficients of thermal expansion (CTE is $3.25 \times 10^{-6}1°$ C.), which makes the substrate 10 more dimensionally stable. The lower CTE also makes the substrate 10 less subject to stress caused by thermal expansion, and thus less vulnerable to cracking from thermal shock. In some other embodiments, the substrate 10 is made of silica 59%, soda ($Na_2O$) 2.0%, lead oxide (PbO) 25%, potassium oxide ($K_2O$) 12%, alumina 0.4% and zinc oxide (ZnO) 1.5%. The substrate 10 has a high refractive index, which provides a more brilliant appearance. In this case, the substrate 10 also has a high elasticity and hence, is more workable in the factory, but the substrate 10 cannot withstand heating very well. In other embodiments, the substrate 10 is made of silica 57%, alumina 16%, boric oxide ($B_2O_3$) 4.0%, barium oxide (BaO) 6.0%, magnesia 7.0% and lime 10%. In another embodiment, the substrate 10 is made of alumina 90% and germanium oxide ($GeO_2$) 10%.

In some embodiments, a CTE value of the substrate 10 is controllable in accordance with the composition as previously discussed. The CTE value is from about $3.1 \times 10^{-6}/°$ C. to about $3.28 \times 10^{-6}/°$ C. In certain embodiments, a CTE value of the substrate 10 is from about $3.47 \times 10^{-6}/°$ C. to about $3.92 \times 10^{-6}/°$ C. In some other embodiments, a CTE value of the substrate 10 is from about $3.47 \times 10^{-6}/°$ C. to about $3.92 \times 10^{-6}/°$ C. In some certain embodiments, a CTE value of the substrate 10 is from about $4.13 \times 10^{-6}/°$ C. to about $4.41 \times 10^{-6}/°$ C. In other embodiments, a CTE value of the substrate 10 is from about $4.43 \times 10^{-6}/°$ C. to about $4.78 \times 10^{-6}/°$ C. In another embodiment, a CTE value of the substrate 10 is from about $5.54 \times 10^{-6}/°$ C. to about $5.81 \times 10^{-6}/°$ C.

In some embodiments, as in FIG. 1, a transparent film 20 or a CTE-adjusted film has a top surface 21 and a bottom surface 22, both of which are lying parallel. The transparent film 20 is disposed under the substrate 10 and is used to form a CTE mismatch between the substrate 10 and the transparent film 20. The CTE mismatch therebetween is adjusted in accordance with several factors, such as a thickness of the transparent film 20. The thickness of the transparent film 20 is adjusted to acquire a desired CTE mismatch between the substrate 10 and the transparent film 20. The thickness of the transparent film 20 is from about 10 μm to about 200 μm. In certain embodiments, the thickness of the transparent film. 20 is from about 13 μm to about 195 μm. In other embodiments, the thickness of the transparent film 20 is from about 27 μm to about 175 μm. In some other embodiments, the thickness of the transparent film 20 is from about 85 μm to about 134 μm.

Figure 2:
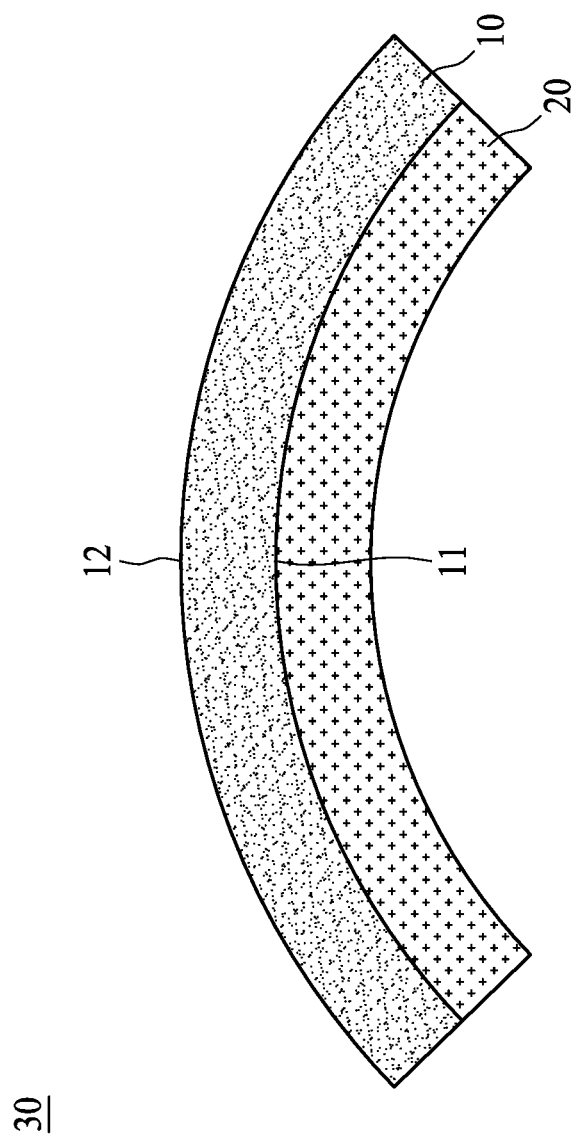
FIG. 2 is a cross-sectional view of an assembly including a substrate and a transparent film having a CTE greater than a CTE of the substrate in accordance with certain embodiments of the present disclosure.

In some embodiments, the transparent film 20 is made of polymers or epoxy and allows an optical radiation or electromagnetic wave to travel through. Compared with the substrate 10, the transparent film 20 has a CTE (about $5.0 \times 10^{-6}/°$ C. to about $1.8 \times 10^{-4}/°$ C.) greater than the CTE of the substrate 10. Since the transparent film 20 is usually attached with the substrate 10 under a high temperature condition, a convex warpage of an assembly 30, including the substrate 10 and the transparent film 20, occurs under a relative low temperature condition as shown in FIG. 2. The warpage generally results from a CTE mismatch between the transparent film 20 and the substrate 10; especially when the CTE of the transparent film 20 is distinguishable from the CTE of the substrate 10. Compared with the CTE of the substrate 10, the CTE of the transparent film 20 is about 15 to about 50 times greater than that of the substrate 10.

Figure 3:
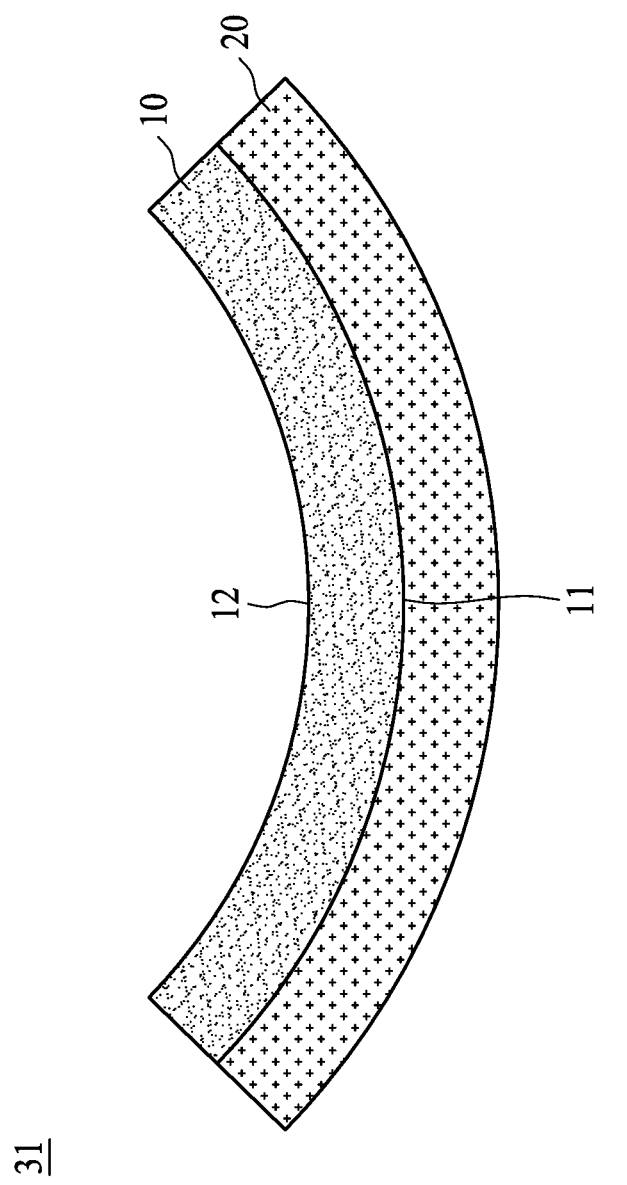
FIG. 3 is a cross-sectional view of an assembly including a substrate and a transparent film having a CTE smaller than a CTE of the substrate in accordance with other embodiments of the present disclosure.

In certain embodiments, if a subsequent processing of forming several layers on the substrate 10 has a tendency to form a convex warpage of WLP as a whole, the CTE value of the transparent film 20 is adjusted to be smaller than the CTE of the substrate 10 so as to compensate the convex warpage of the WLP. In this case the CTE of the transparent film 20 is from about $1.0 \times 10^{-6}/°$ C. to about $2.8 \times 10^{-6}/°$ C. In other embodiments, the CTE of the transparent film 20 is from about $2.8 \times 10^{-6}/°$ C. to about $5.0 \times 1.0^{-6}/°$ C. Because the CTE of the substrate 10 is greater than the CTE of the transparent film 20, which is attached under the substrate 10 at a high temperature condition, a concave warpage of an assembly 31 including the transparent film 20 and the substrate 10 is formed at a relative low temperature as shown in FIG. 3. Thus, even if the tendency of the subsequent processing is to form a convex warpage of the WLP, the predetermined concave warpage of the assembly 31 is useful to counteract an internal stress leading to convex warpage of the WLP.

Figure 4:
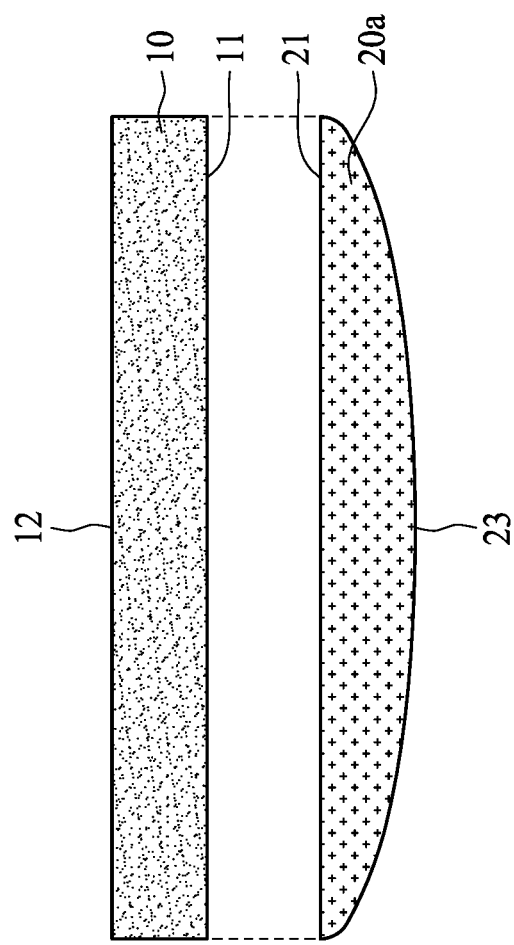
FIG. 4 is a cross-sectional view of a transparent film having a top flat surface and a convex bottom surface in accordance with some embodiments of the present disclosure.
Figure 5:
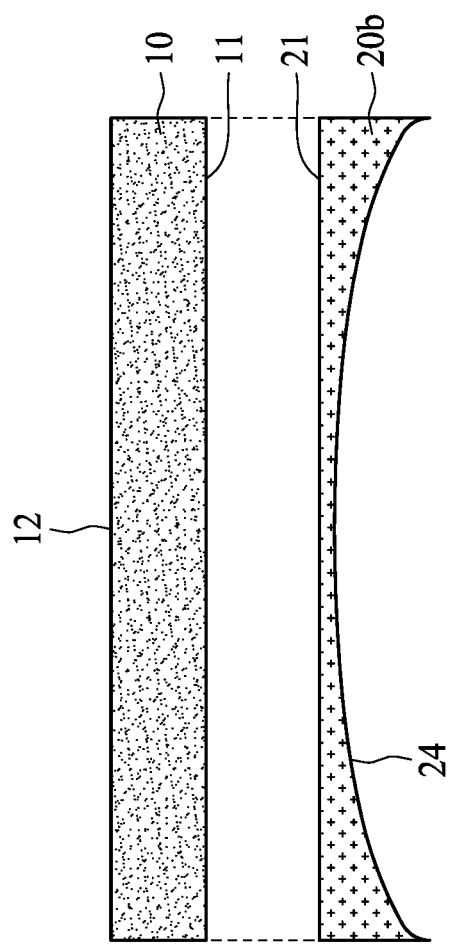
FIG. 5 is a cross-sectional view of a transparent film having a top flat surface and a concave bottom surface in accordance with some embodiments of the present disclosure.

The present disclosure provides several types of transparent films to counteract the internal stress, which causes the warpage of the WLP. In some embodiments, as in FIG. 4, the transparent film 20a has a flat top surface 21 and a convex bottom surface 23 and thus, the transparent film 20a has a planar-convex cross-section. The planar-convex cross-section is useful to counteract or compensate an undesirable warpage of the WLP resulting from a complicated WLP processing. In certain embodiments, as in FIG. 5, the transparent film 20b has a flat top surface 21 and a concave bottom surface 24. In other words, the transparent film 20b has a planar-concave cross-section, which efficiently counteracts an undesirable warpage due to a CTE mismatch of the substrate 10 and a product of WLP processing. In some other embodiments, the convex or concave curve of the cross-section does not need to be smooth, but may be built of steps. Such steps are provided, for example, by successive concentric layers.

In some embodiments, the transparent film 20 has one or more apertures (not shown) placed therein. These apertures relieve the bending forces provided by the transparent film 20. Such a relief is useful in situation where there is little warpage in the surrounding area of the die (not shown), and thus causes warpage counteracting compensation to be unnecessary. In certain embodiments, apertures are useful in a condition presenting more complex warpages rather than simple convex or simple concave warpages. As counteracting forces are released to zero near the surrounding area of the aperture, warpage compensation can be tailored more precisely to the needs of a particular WLP. Additionally, the cross-section of the transparent film 20 takes on a shape that coordinates with the apertures. For example, in the case of a single central aperture, the cross-section takes on the shape of a half-torus, tapering from a highest point to both the periphery and center.

Figure 6:
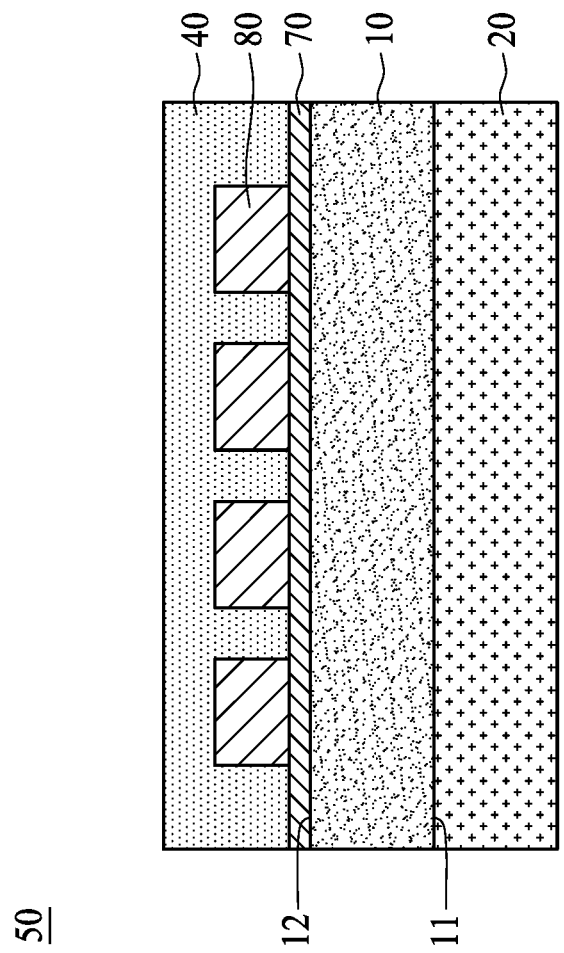
FIG. 6 is a cross-sectional view of a die attach film disposed on the substrate and several dies located on the die attach film in accordance with some embodiments of the present disclosure.

In some embodiments, as in FIG. 6, a die attach film (DAF) 70 is disposed on the substrate 10 for a die 80 bonding. The DAF 70 is a thermal sensitive or light sensitive material, which becomes vulnerable or fragile when the DAF 70 is exposed under thermal energy or an electromagnetic wave.

In some embodiments, as in FIG. 6, the molding compound 40 or polymeric material is disposed on the second surface 12 and configured to cover the die 80. Because of the material characteristic of the molding compound 40, a CTE of the molding compound 40 is greater than the CTE of the substrate 10 and ranges from about $6.2 \times 10^{6}/^\circ$ C. to about $9.8 \times 10^{6}/^\circ$ C. in certain embodiments, the CTE of the molding compound 40 is from about $7.5 \times 10^{-6}/^\circ$ C. to about $1.3 \times 10^{-5}/^\circ$ C. In other embodiments, the CTE of the molding compound 40 is from about $8.4 \times 10^{-6}/^\circ$ C. to about $3.9 \times 10^{-5}/^\circ$ C. In some other embodiments, the CTE of the molding compound 40 is from about $9.2 \times 10^{-6}/^\circ$ C. to about $3.3 \times 10^{-5} 1^\circ$ C. In other words, the CTE of the molding compound 40 is smaller than the CTE of the transparent film 20. In some certain embodiments, the molding compound 40 includes a material property, which is sensitive to thermal energy or electromagnetic energy.

A method for a coefficient of a thermal expansion mismatch is used to compensate a warpage during the WLP processing. The method includes a number of operations and the description and illustrations are not deemed as a limitation as to the order of the operations.

A term "depositing" or "deposited" is used in the present disclosure to describe an operation of locating materials on a substrate using a vapor phase of a material to be deposited, a precursor of the material, an electrochemical reaction, or sputtering/reactive sputtering. The depositing operation includes various steps and processes and varies in accordance with the features of the embodiments. In some embodiments, depositions using a vapor phase of a material include any operations such as, but not limited to, chemical vapor deposition (CVD) and physical vapor deposition (PVD). Examples of vapor deposition methods include hot filament CVD, rf-CVD, laser CVD (LCVD), conformal diamond coating operations, metal-organic CVD (MOCVD), thermal evaporation PVD, ionized metal PVD (IMPVD), electron beam PVD (EBPVD), reactive PVD, atomic layer deposition (ALD), plasma enhanced CVD (PECVD), high density plasma CVD (HDPCVD), low pressure CVD (LPCVD), and the like. Examples of deposition using an electrochemical reaction include electroplating, electroless plating, and the like. Other examples of deposition include pulse laser deposition (PLD), and atomic layer deposition (ALD).

A term "ramping down" or "ramped down" is used in the present disclosure to describe an operation of quickly cooling an object. The ramping operation includes various steps and processes and varies in accordance with the features of embodiments. In some embodiments, the ramping operation includes simultaneously cooling down a substrate and a film so as to shrink the volumes of the substrate and the film in different degree.

Figure 7:
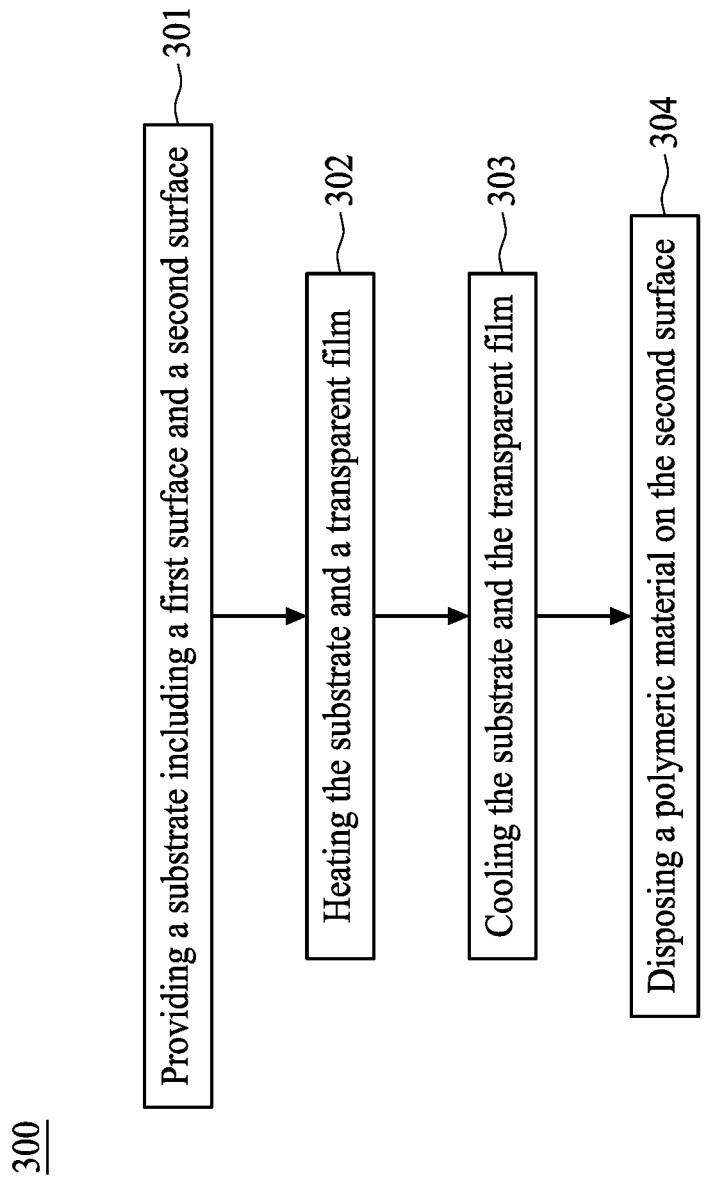
FIG. 7 is a flowchart of a method for attaching a transparent film to form a CTE mismatch in accordance with some embodiments of the present disclosure.

FIG. 7 is a diagram of a method 300 for a coefficient of a thermal expansion mismatch in accordance with some embodiments of the present disclosure. The method 300 includes several operations which are discussed in detail with reference to FIGS. 8 to 12. At operation 301, a substrate is provided and includes a first surface and a second surface. At operation 302, the substrate and a transparent film are heated to attach the transparent film on the first surface, wherein a first coefficient of the thermal expansion (CTE) mismatch is formed between the substrate and the transparent film. At operation 303, the substrate and the transparent film are cooled. At operation 304, a polymeric material is disposed on the second surface, wherein a second CTE mismatch is formed between the substrate and the polymeric material. The second CTE mismatch is counteracted by the first CTE mismatch.

FIGS. 8 to 12 have been simplified for a better understanding of the inventive concepts of the present disclosure. In FIGS. 8 to 12, elements with the same labeling numbers as those in FIGS. 1 to 6 are previously discussed with reference thereto and are not repeated here for simplicity.

Figure 8:
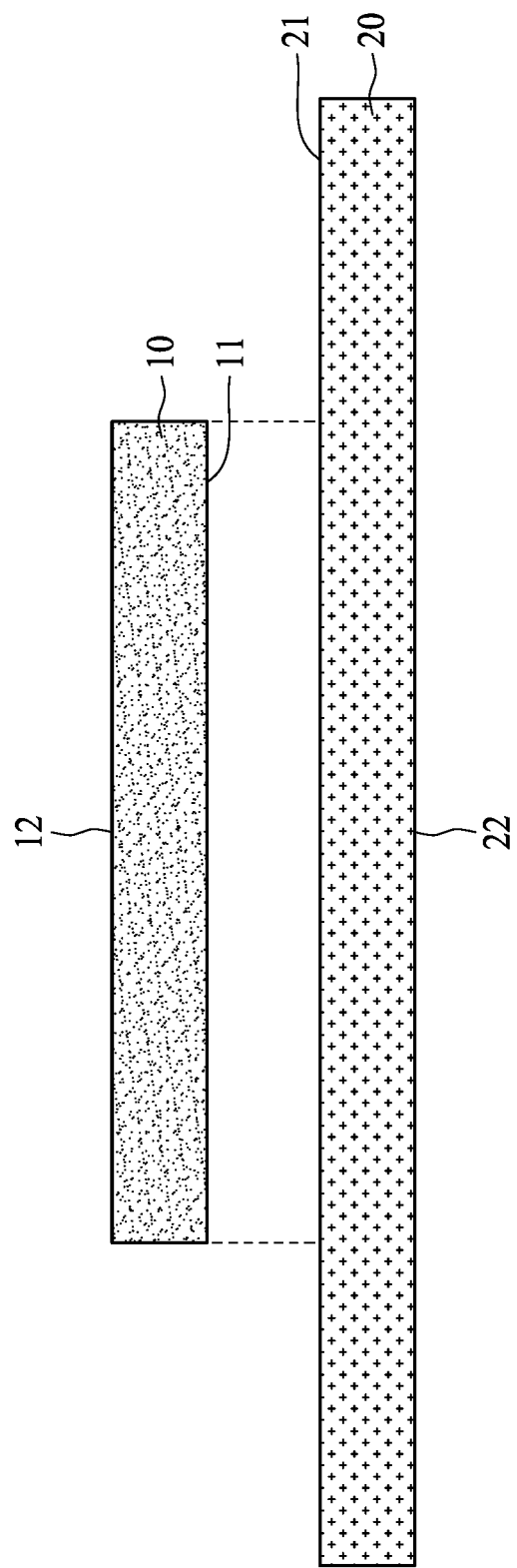
FIG. 8 is a cross-sectional view of a substrate above a transparent film in accordance with some embodiments of the present disclosure.

Referring to FIG. 8, the substrate 10 and a transparent film 20 are provided. The substrate 10 includes a first surface 11 and a second surface 12. Since the CTE of the substrate 10 is different from the CTE of the transparent film 20, their degrees of expansion in response to a change in temperature are distinguishable. In some embodiments, as in FIG. 8, the substrate 10 and the transparent film 20 are heated in a temperature from about 50° C. to about 200° C. In certain embodiments, the heating condition is from about 58° C. to about 192° C. In other embodiments, the heating condition is from about 79° C. to about 162° C. In some certain embodiments, the heating condition is from about 42° C. to about 264° C. After the above-identified temperature is achieved, the heated transparent film 20 is pressed for bonding on the heated substrate 10.

Figure 9:
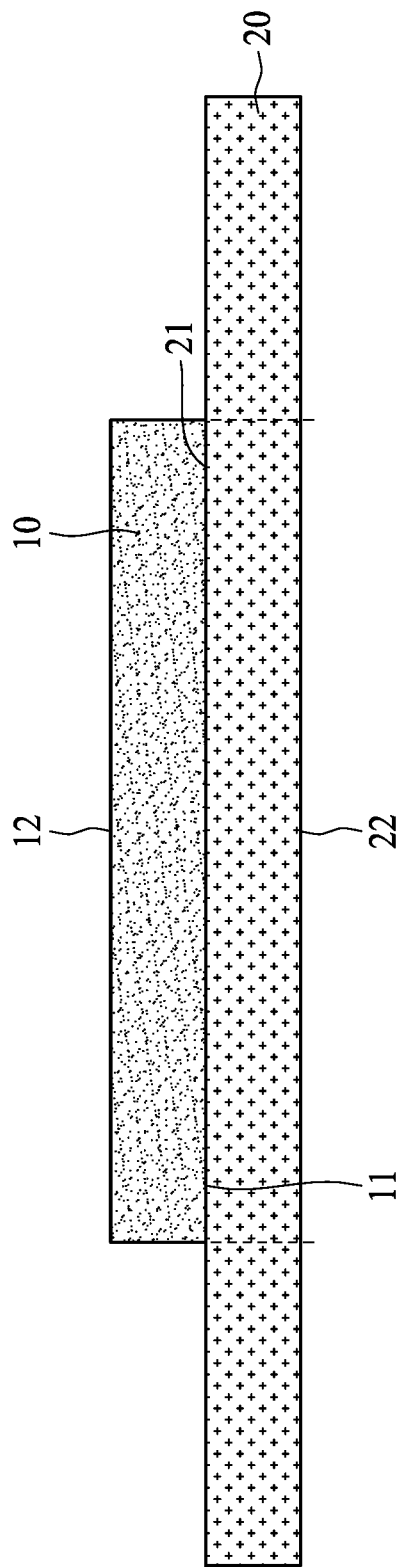
FIG. 9 is a cross-sectional view of a substrate attaching on a transparent film in a high temperature condition in accordance with some embodiments of the present disclosure.
Figure 10:
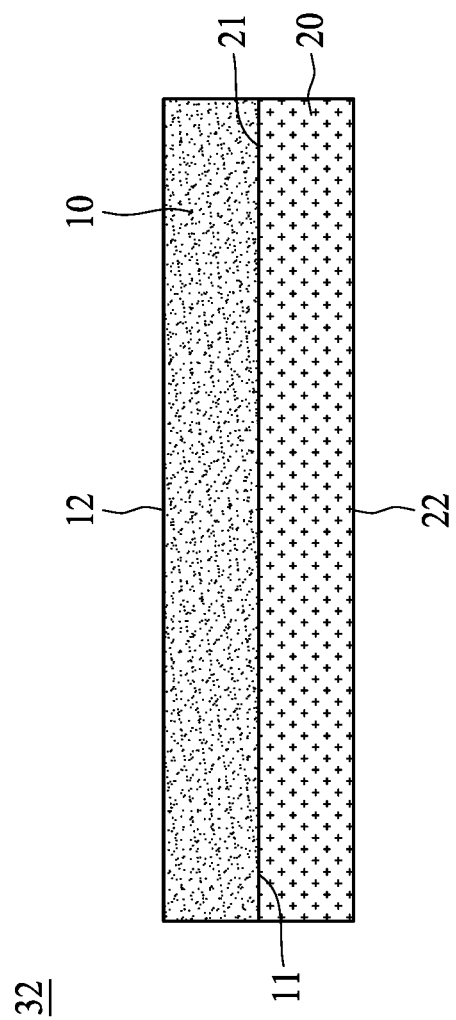
FIG. 10 is a cross-sectional view of removing a portion of a transparent film in a high temperature condition in accordance with some embodiments of the present disclosure.

Under a high temperature condition, the substrate 10 and the transparent film 20 have been enlarged in volume. While in this enlarged condition, the transparent film 20 is attached or bonded on the first surface 11 of the substrate 10 as shown in FIG. 9. Subsequently, an unnecessary portion of the transparent film 20 is removed, and hence an assembly 32 of the substrate 10 and the transparent film 20 takes on a shape as shown in FIG. 10. At this moment, the CTE of the substrate 10 is different from the CTE of the transparent film 20, but the volumes of the substrate 10 and the transparent film 20 are equal.

Once the substrate 10 and the transparent film 20 are cooled down, their degrees of shrinkage in response to a change in temperature are distinguishable such that either the substrate 10 or the transparent film 20 has a smaller volume than that of the other. Thus, a warpage between the substrate 10 and the transparent film 20 is formed. In some embodiments, if the transparent film 20 includes a CTE greater than a CTE of the substrate 10, the warpage appears as shown in FIG. 2, as previously discussed. In other words, the second surface 12 is deformed to be a convex surface after cooling the substrate 10 and the transparent film 20. In certain embodiments, if the transparent film 20 includes a CTE smaller than a CTE of the substrate 10, the warpage appears as shown in FIG. 3.

Figure 11:
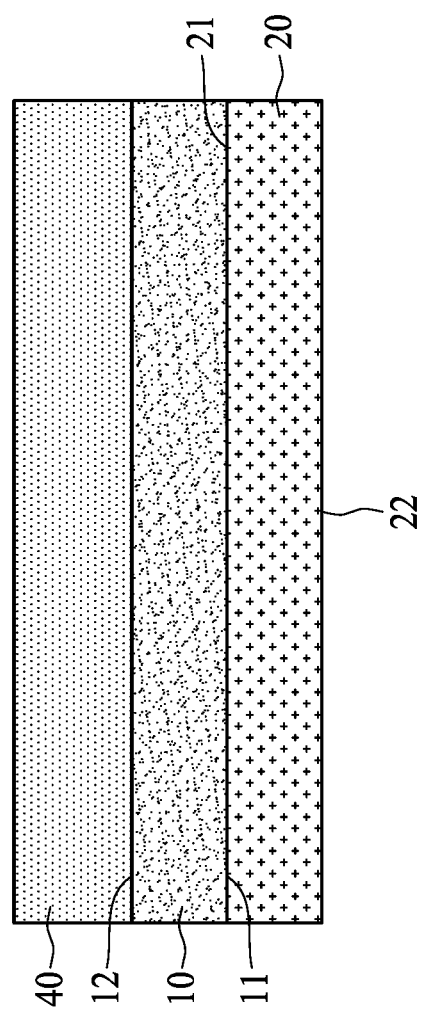
FIG. 11 is a cross-sectional view of attaching a molding compound in accordance with some embodiments of the present disclosure.

In some embodiments, a polymeric material or the molding compound 40 is disposed on the second surface 12. In the case of processing, the temperature is risen such that the assembly 30 shown in FIG. 2 is deformed to take on a shape similar to the assembly 32 shown in FIG. 10. Thus, the polymeric material or molding compound 40 is evenly disposed on the substrate 10 as shown in FIG. 11. Since the polymeric material includes a CTE greater than the CTE of the substrate 10, a CTE mismatch is formed between the substrate 10 and the polymeric material. When the temperature is going down, the shape of the substrate 10, the transparent film 20, and the polymeric material still maintains since the first CTE mismatch between the substrate 10 and the transparent film 20 is counteracted by the second CTE mismatch between the substrate 10 and the polymeric material.

Figure 12:
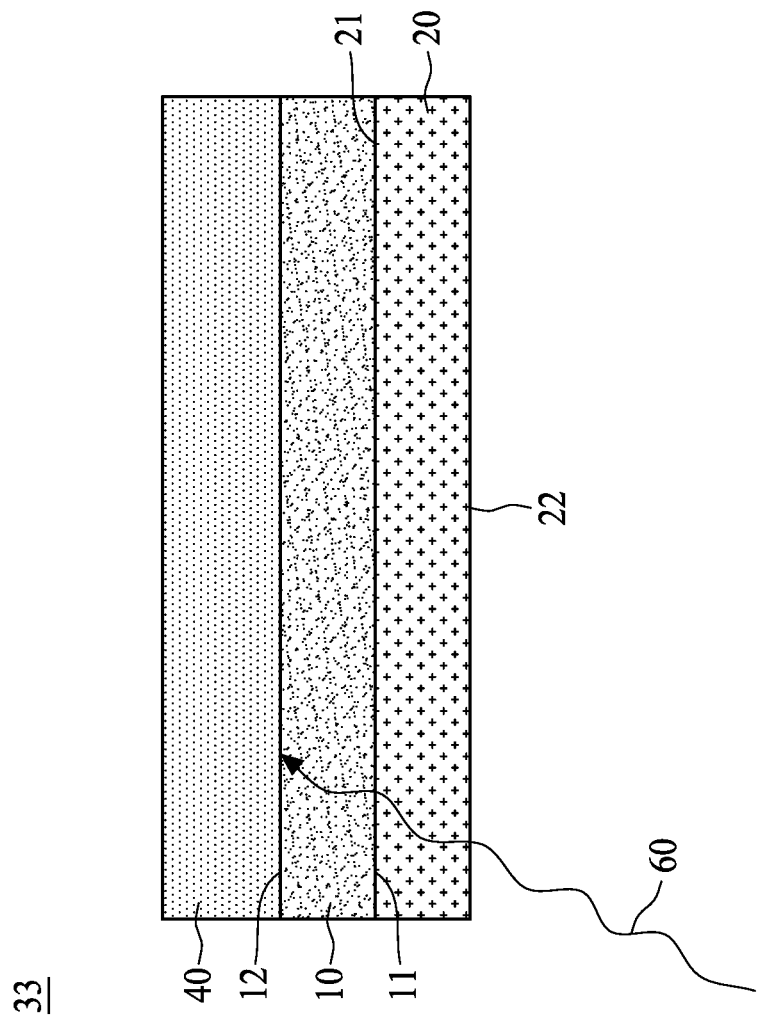
FIG. 12 is a cross-sectional view of radiating an electromagnetic wave toward a molding compound in accordance with some embodiments of the present disclosure.

In some embodiments, as in FIG. 12, an electromagnetic wave 60 is radiated through the transparent film 20 and the substrate 10 toward a second surface 12. The polymeric material or molding compound 40 is degradable under the exposure of the electromagnetic wave 60, a portion of the polymeric material near the interface between the second surface 12 and the polymeric material is degraded and then a major portion of the polymeric material is detached from the substrate 10. Once the polymeric material is detached from the substrate 10, the shape of the transparent film 20 and the substrate 10 restores similar to the appearance of the assembly 30 shown in FIG. 2 in order to perform the next polymeric material disposing operation.

Figure 13:
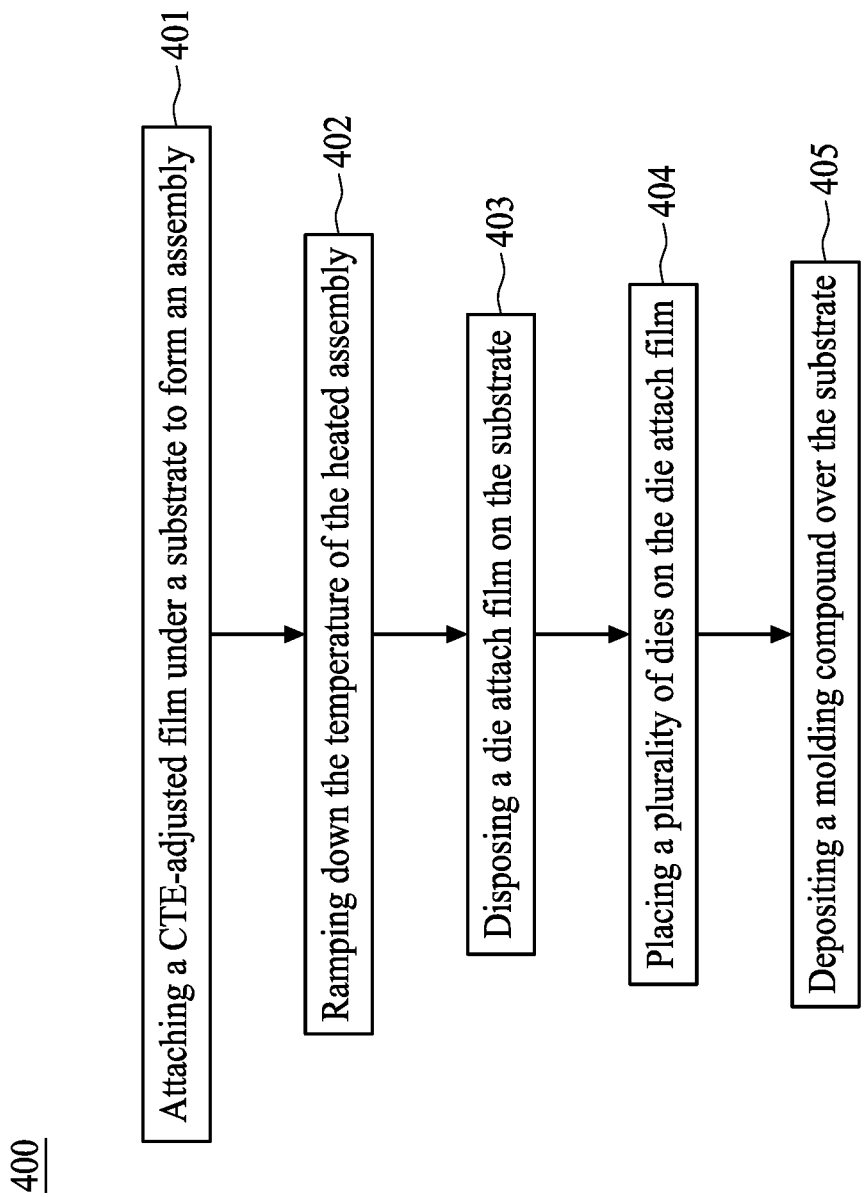
FIG. 13 is a flowchart of attaching a CTE-adjusted film under a substrate to form a CTE mismatch in accordance with some embodiments of the present disclosure.

FIG. 13 is a diagram of a method 400 for a coefficient of a thermal expansion mismatch in accordance with some embodiments of the present disclosure. The method 400 includes several operations which are discussed in detail with reference to FIGS. 14 to 16. At operation 401, a CTE-adjusted film is attached under a substrate to form an assembly through a heating operation. At operation 402, the temperature of the heated assembly is ramped down to generate an internal stress inside the assembly. At operation 403, a die attach film is disposed on the substrate. At operation 404, a plurality of dies are placed on the die attach film. At operation 405, a molding compound is deposited over the substrate to counteract the internal stress inside the assembly.

Figure 14:
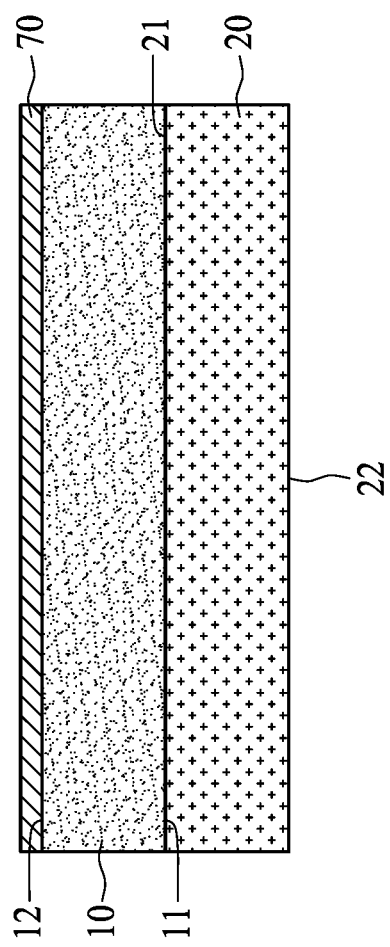
FIG. 14 is a cross-sectional view of attaching a die attach film on a substrate in accordance with some embodiments of the present disclosure.
Figure 15:
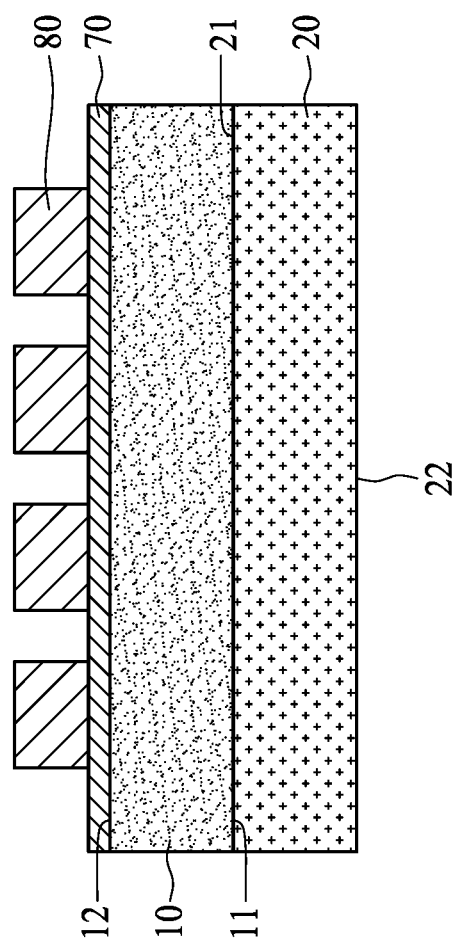
FIG. 15 is a cross-sectional view of locating several dies on a die attach film in accordance with some embodiments of the present disclosure.
Figure 16:
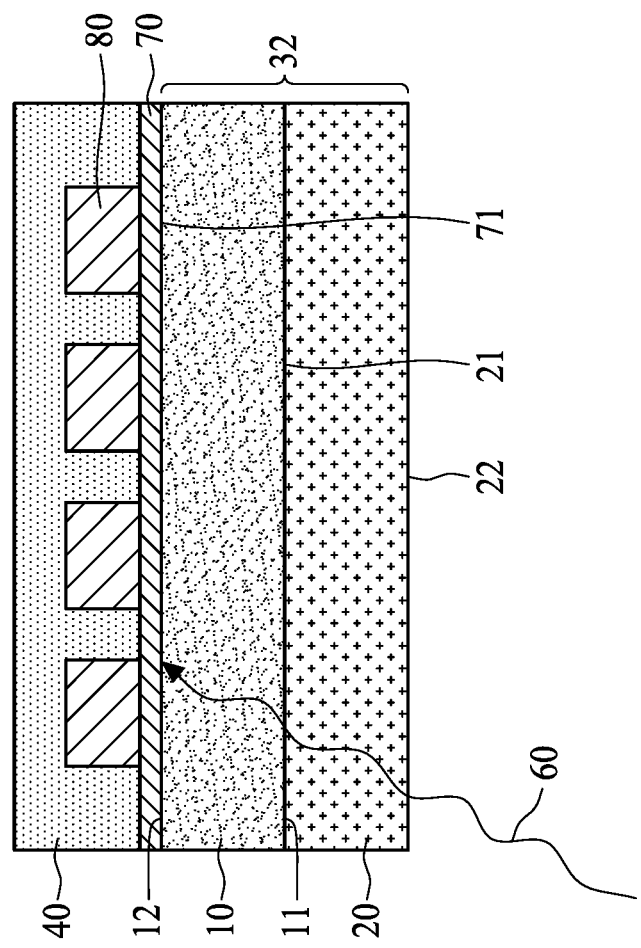
FIG. 16 is a cross-sectional view of disposing a molding compound to cover a die attach film in accordance with some embodiments of the present disclosure.

FIGS. 14 to 16 have been simplified for a better understanding of the inventive concepts of the present disclosure. In FIGS. 14 to 16, elements with the same labeling numbers as those in FIGS. 1 to 6 are previously discussed with reference thereto and are not repeated here for simplicity.

Referring back to FIG. 10, the transparent film 20 has a function to adjust the CTE value of the assembly 32 and is also called a CTE-adjusted film, which is attached under the substrate 10 to form the assembly 32 through the heating operation as previously discussed. After the temperature of the heated assembly 32 is ramped down, an internal stress is generated inside the assembly 32 such that the assembly 32 is warped as shown in either FIG. 2 or FIG. 3. In addition, the transparent film 20 or CTE-adjusted film includes a polymeric material so as to increase the CTE value of the transparent film 20 or the warpage degree of the assembly 32.

In some embodiments shown in FIG. 14, a die attach film (DAF) 70 is disposed on the second surface 12 of the substrate 10 for bonding of dies 80. In the case of processing, the temperature is risen again such that the assembly 32 restores its shape shown in FIG. 10 so as to smoothly place the DAF 70 on the substrate 10. In certain embodiments, as in FIG. 15, several dies 80 are placed on the DAF 70. The DAF 70 is a light sensitive material which becomes degradable when the DAF 70 is exposed under an electromagnetic wave. The electromagnetic wave includes a wavelength from about 780 nm to about 1350 nm. In certain embodiments, the wavelength is from about 845 nm to about 1294 nm. In other embodiments, the wavelength is from about 937 nm to about 1159 nm. In some other embodiments, the wavelength is from about 1015 nm to about 1105 nm.

In some embodiments, as in FIG. 16, the polymeric material or the molding compound 40 is deposited over the substrate 10 so as to form an intermediate 90. In the case of processing, the temperature is risen so as to smoothly deposit the molding compound 40 over the DAF 70 and cover the dies 80. After the deposition operation, the molding compound, the DAF 70, the substrate 10 and the CTE-adjusted film are cooled. Although the CTE of the molding compound 40 is much greater than the CTE of the substrate 10, the intermediate 90 will not be warped since the internal stress of the assembly 32 counteracts the CTE mismatch between the molding compound 40 and the substrate 10.

In some embodiments, the assembly 32 is regarded as a component, which includes its own effective CTE. In this case, even if the effective CTE of the assembly 32 is greater than the CTE of the molding compound, the intermediate 90 will not be warped since the DAF 70, the dies 80 and the molding compound 40 are regarded as an integrated piece, whose CTE value is equal to the effective CTE of the assembly 32. Therefore, there is no CTE mismatch between the assembly 32 and the integrated piece in such a way that the intermediate 90 does not deform.

In some embodiments, as in FIG. 16, after the molding compound depositing operation, a WLP including the dies 80 and the molding compound 40 is completed. In order to separate the WLP from the substrate 10, the DAF 70 has to be removed, thereby separating the molding compound 40 from the substrate 10; simultaneously, the dies 80 are separated from the substrate 10. In certain embodiments, a light source (not shown) emits the electromagnetic wave 60 through the transparent film 20, which has about 90% to about 99% transmittance to the electromagnetic wave 60 with a wavelength of about 1060 nm. In other words, the light source is a 1060 nm $CO_2$ laser. The DAF 70 is degraded under the exposure of the electromagnetic radiation or wave 60, which is applied on an interface 71 between the DAF 70 and hence the substrate 10 so as to detach the die 80 or WLP from the substrate 10. Once the molding compound 40 or WLP is detached from the substrate 10, the shape of the transparent film 20 and the substrate 10 restores similar to the appearance of either the assembly 30 shown in FIG. 2 or the assembly 31 shown in FIG. 3 in order to perform the next WLP forming operation.

Figure 17:
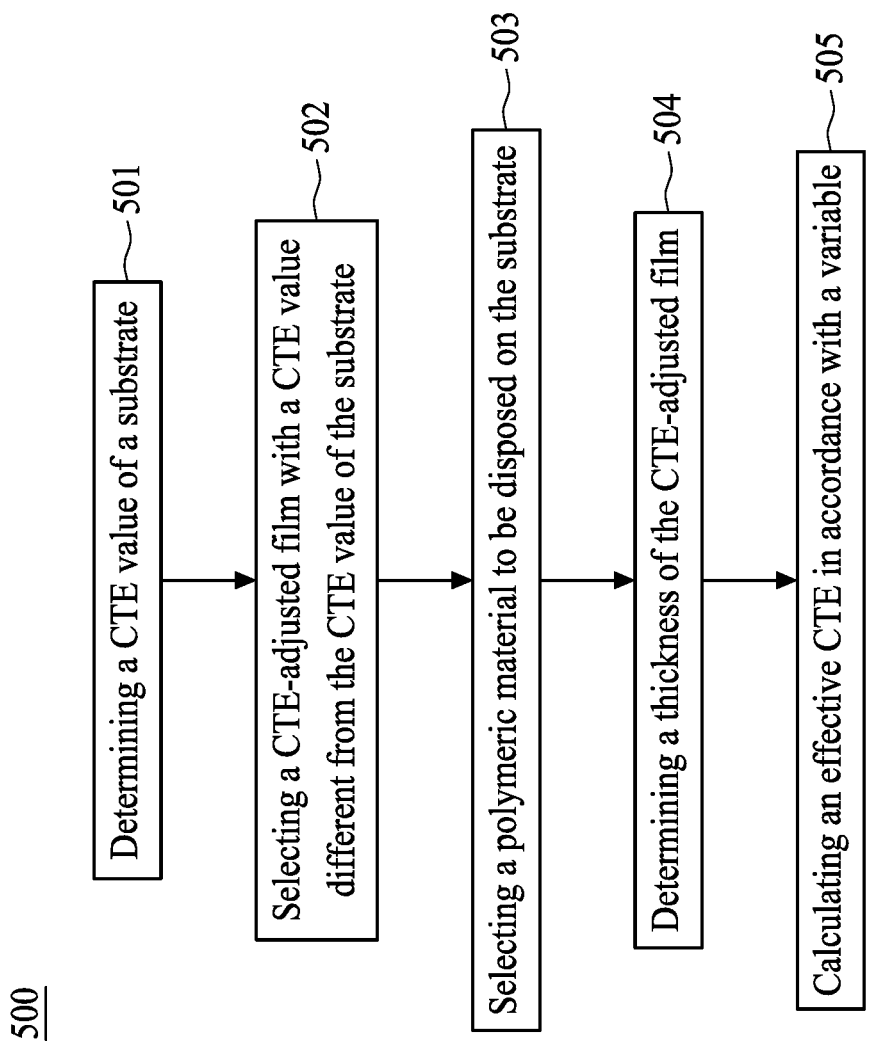
FIG. 17 is a flowchart of determining a CTE value of a substrate to calculate an effective CTE in accordance with some embodiments of the present disclosure.

FIG. 17 is a diagram of a method 500 for a coefficient of a thermal expansion mismatch in accordance with some embodiments of the present disclosure. The method 500 includes several operations, which are discussed in detail with reference to Table 1. At operation 501, a CTE value of a substrate is determined. At operation 502, a CTE-adjusted film is selected to include a CTE value different from the CTE value of the substrate. At operation 503, a polymeric material or molding compound is selected to be disposed on the substrate with a different CTE than that of the substrate. At operation 504, a thickness of the CTE-adjusted film is determined. At operation 505, an effective CTE is calculated in accordance with a variable, which includes the CTE of the substrate, the CTE of the CTE-adjusted film and the thickness of the CTE-adjusted film.

Several factors are determined in accordance with the method 500 as previously discussed and arranged in Table 1. In some embodiments, the CTE value of the substrate is determined to be about 3.8 ppm/° C. or $3.8 \times 10^{-6}$/° C. Subsequently, the thickness of the substrate is also determined to be about 800 μm. The CTE value of the CTE-adjusted film is selected and is different from the CTE value of the substrate (about $3.8 \times 10^{-6}$/° C.). In this case, the CTE value of the CTE-adjusted film is about $1.5 \times 10^{-4}$/° C. or 150 ppm/° C. A molding compound is selected to be disposed on the substrate with a CTE value (about 8.0 ppm/° C.). Since the molding compound is used to cover the die, the thickness of the die is almost equal to the thickness of the molding compound. The thickness of the die is determined to be about 250 μm. The thickness of the CTE-adjusted film is determined or selected to be four groups, respectively (e.g., 0 μm, 10 μm, 20 μm, 30 μm). Since the effective CTE is calculated and used to counteract a portion of the CTE mismatch between the molding compound and the substrate based on an assumption that the CTE of the die is able to be ignored, a WLP warpage at 25° C. is determined or predicted, respectively in Table

TABLE 1

| Film Thickness (μm) | 0 | 10 | 20 | 30 |
|---|---|---|---|---|
| Film CTE (ppm/° C.) | | 150 | | |
| Die Thickness (μm) | | 250 | | |
| Molding compound CTE (ppm/° C.) | | 8.0 | | |
| Substrate CTE (ppm/° C.) | | 3.8 | | |
| Substrate Thickness (μm) | | 800 | | |
| WLP warpage at 25° C. (μm) | −214 | −139 | 239 | 390 |

In some embodiments, a polynomial is introduced to calculate a warpage of a structure 33 constructed with the substrate 10, the CTE-adjusted film 20, and the polymeric material or the molding compound 40 as shown in FIG. 12. In certain embodiments, the polynomial is described as follows:

$$y(\text{warpage}) = ax^2 + bx + c;$$

wherein a, b and c are coefficients of the single variable polynomial; and x is the variable including one of the CTE of the substrate, the CTE of the CTE-adjusted film, and the thickness of the CTE-adjusted film.

Figure 18:
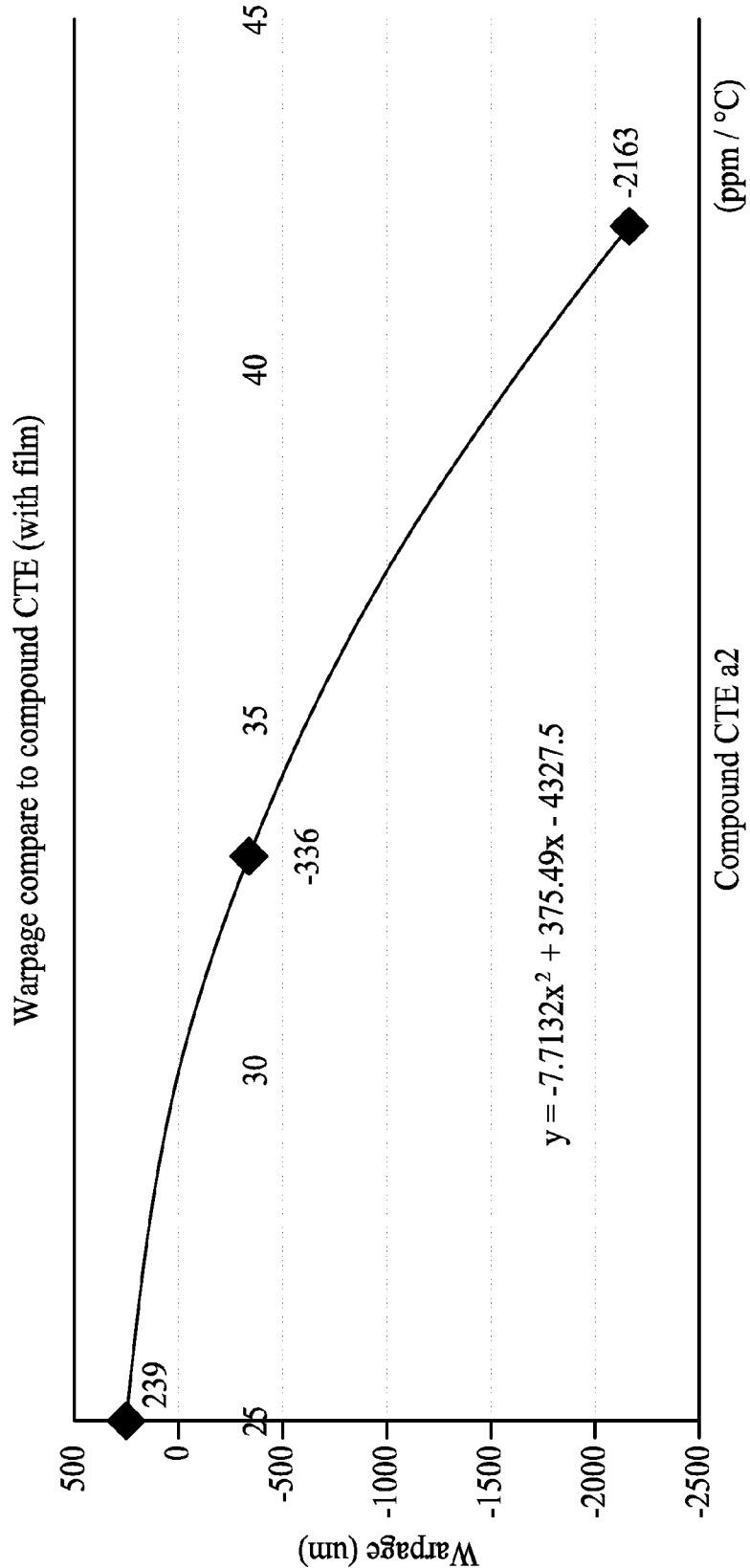
FIG. 18 is a schematic view of a polynomial relating to a warpage and a CTE of the molding compound in accordance with other embodiments of the present disclosure.

In some embodiments, as in FIG. 18, the coefficient a is −7.7132; the coefficient b is 375.49; and the coefficient c is −4327.5. The variable x is the CTE value of the molding compound.

In some embodiments, a method includes providing a substrate including a first surface and a second surface. The method also includes heating the substrate and a transparent film so as to attach the transparent film on the first surface, wherein a first coefficient of the thermal expansion mismatch is between the substrate and the transparent film. The method also includes cooling the substrate and the transparent film. The method also includes disposing a polymeric material of the second surface. A second CTE mismatch is between the substrate and the polymeric material, and the second CTE mismatch is counteracted by the first CTE mismatch.

In some embodiments, a method includes attaching a CTE-adjusted film under a substrate to form an assembly through a heating operation. The method also includes ramping down the temperature of the heated assembly to generate an internal stress inside the assembly. The method also includes disposing a die attach film on the substrate. The method also includes placing a plurality of dies on the die attach film. The method also includes depositing a molding compound over the substrate to counteract the internal stress inside the assembly.

In some embodiments, a method includes determining a CTE value of a substrate. The method also includes selecting a CTE-adjusted film with a CTE value different from the CTE value of the substrate. The method also includes selecting a polymeric material to be disposed on the substrate with a different CTE than that of the substrate. The method also includes determining a thickness of the CTE-adjusted film. The method also includes calculating an effective CTE in accordance with a variable including: the CTE of the substrate, the CTE of the CTE-adjusted film and the thickness of the CTE-adjusted film.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing the claims.

Various operations of embodiments are provided herein. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein. It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments.

Further, unless specified otherwise, "first," "second," or the like are not intended to imply a temporal aspect, a spatial aspect, an ordering, etc. Rather, such terms are merely used as identifiers, names, etc. for features, elements, items, etc. For example, a first channel and a second channel generally correspond to channel A and channel B or two different or two identical channels or the same channel.

As used in this application, "or" is intended to mean an inclusive "or" rather than an exclusive "or." In addition, "a" and "an" as used in this application are generally to be construed to mean "one or more" unless specified otherwise or clear from context to be directed to a singular form. Furthermore, to the extent that "includes", "having", "has", "with", or variants thereof are used in either the detailed description or the claims, such terms are intended to be inclusive in a manner similar to "comprising."

What is claimed is:

1. A method, comprising:
   attaching a CTE-adjusted film under a substrate to form an assembly through a heating operation;
   ramping down the temperature of the heated assembly to generate an internal stress inside the assembly;
   disposing a die attach film on the substrate;
   placing a plurality of dies on the die attach film;
   depositing a molding compound over the substrate to counteract the internal stress inside the assembly.

2. The method of claim 1, wherein the assembly includes an effective CTE greater than a CTE of the molding compound.

3. The method of claim 1, wherein the assembly warps after ramping down the temperature.

4. The method of claim 1, further comprising removing the die attach film, thereby separating the molding compound from the substrate.

5. The method of claim 1, further comprising applying electromagnetic radiation on an interface between the die attach film and the substrate so as to detach the dies from the substrate.

6. The method of claim 5, wherein a wavelength of the electromagnetic radiation is about 1060 nm.

7. The method of claim 1, wherein the CTE-adjusted film includes a polymeric material.

8. A method, comprising:
providing a substrate having a first CTE, wherein the substrate has a first surface and a second surface;
providing a first layer having a second CTE;
attaching the first layer on the first surface of the substrate; and
disposing a second layer having a third CTE on the second surface;
wherein a first mismatch between the first CTE and the second CTE counteracted by a second mismatch between the third CTE and the second CTE to a heating temperature.

9. The method of claim 8, wherein the first layer includes a polymer.

10. The method of claim 8, wherein the second layer includes a wafer level package.

11. The method of claim 10, wherein the wafer level package is disposed on the second surface through a die attach film (DAF).

12. The method of claim 11, wherein the DAF includes a thermal sensitive or light sensitive material.

13. The method of claim 8, wherein the first layer has a planar-convex cross-section.

14. The method of claim 8, wherein the first layer has a planar-concave cross-section.

15. The method of claim 8, wherein the first layer has a half-torus cross-section.

16. The method of claim 8, wherein the heating temperature ranges from about 50° C. to about 200° C.

17. The method of claim 8, further comprising:
detaching the second layer from the second surface of the substrate.

18. A method, comprising:
attaching a CTE-adjusted film under a substrate to form an assembly through a heating operation;
disposing a die attach film on the substrate;
placing a plurality of dies on the die attach film; and
disposing a molding compound over the substrate to counteract the internal stress inside the assembly.

19. The method of claim 18, wherein the dies, the die attach film and the molding compound form an integrated piece, and an effective CTE of the integrated piece equals to an effective CTE of the assembly.

20. The method of claim 18, further comprising applying electromagnetic radiation on an interface between the die attach film and the substrate so as to detach the dies from the substrate.

* * * * *